(12) United States Patent
Fujiki

(10) Patent No.: US 7,961,524 B2
(45) Date of Patent: Jun. 14, 2011

(54) METHOD FOR DRIVING A NONVOLATILE SEMICONDUCTOR MEMORY DEVICE

(75) Inventor: Jun Fujiki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 12/053,108

(22) Filed: Mar. 21, 2008

(65) Prior Publication Data

US 2009/0086549 A1 Apr. 2, 2009

(30) Foreign Application Priority Data

Sep. 27, 2007 (JP) ................................. 2007-252137

(51) Int. Cl.
*G11C 11/04* (2006.01)
(52) U.S. Cl. .......... 365/185.28; 365/185.14; 365/185.29
(58) Field of Classification Search ............. 365/185.28, 365/185.14, 185.29
See application file for complete search history.

(56) References Cited

U.S. PATENT DOCUMENTS

| | | | |
|---|---|---|---|
| 2003/0161192 A1* | 8/2003 | Kobayashi et al. | 365/200 |
| 2005/0006698 A1 | 1/2005 | Matsuzaki et al. | |
| 2005/0237816 A1* | 10/2005 | Lue et al. | 365/185.28 |
| 2007/0036001 A1* | 2/2007 | Kanda et al. | 365/185.18 |
| 2007/0297227 A1* | 12/2007 | Wu | 365/185.03 |

OTHER PUBLICATIONS

U.S. Appl. No. 12/268,648, filed Nov. 11, 2008, Fujiki.
U.S. Appl. No. 12/405,626, filed Mar. 17, 2009, Shingu, et al.

* cited by examiner

*Primary Examiner* — Huan Hoang
*Assistant Examiner* — Anthan T Tran
(74) *Attorney, Agent, or Firm* — Oblon, Spivak, McClelland, Maier & Neustadt, L.L.P.

(57) ABSTRACT

A method for driving a nonvolatile semiconductor memory device is provided. The nonvolatile semiconductor memory device has source/drain diffusion layers spaced from each other in a surface portion of a semiconductor substrate, a laminated insulating film formed on a channel between the source/drain diffusion layers and including a charge storage layer, and a gate electrode formed on the laminated insulating film, the nonvolatile semiconductor memory device changing its data memory state by injection of charges into the charge storage layer. The method includes, before injecting charges to change the data memory state into the charge storage layer: injecting charges having a polarity identical to that of the charges to be injected; and further injecting charges having a polarity opposite to that of the injected charges.

15 Claims, 15 Drawing Sheets

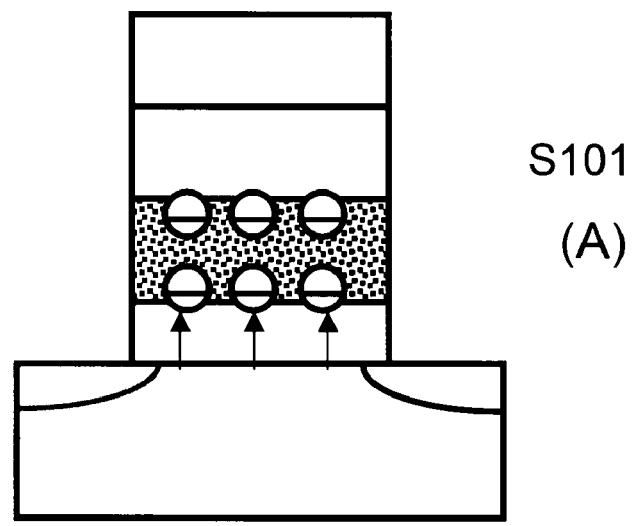
FIG. 4A  S101 (A)
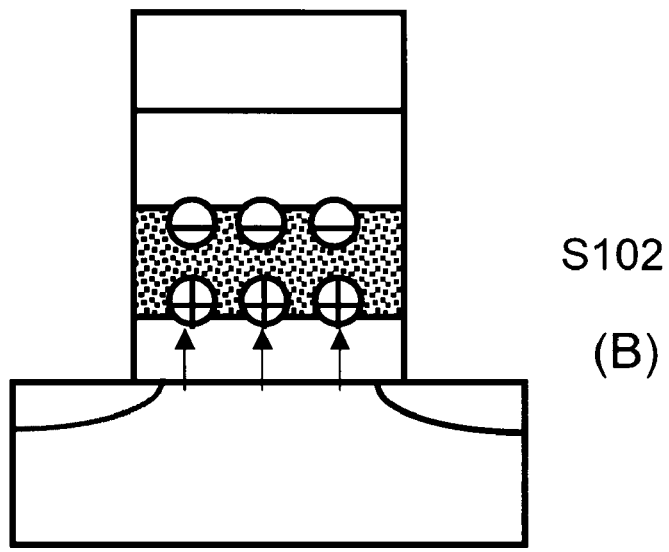
FIG. 4B  S102 (B)
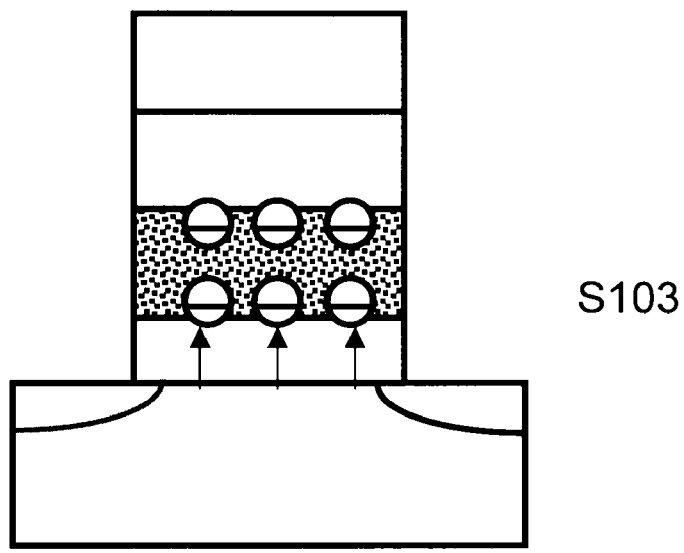
FIG. 4C  S103

S106

(C)

S107

(D)

S108

METHOD FOR DRIVING A NONVOLATILE SEMICONDUCTOR MEMORY DEVICE

CROSS-REFERENCE TO RELATED APPLICATIONS

This application is based upon and claims the benefit of priority from the prior Japanese Patent Application No. 2007-252137, filed on Sep. 27, 2007; the entire contents of which are incorporated herein by reference.

BACKGROUND OF THE INVENTION

1. Field of the Invention

This invention relates to a method for driving a nonvolatile semiconductor memory device based on transistor type memory cells having an insulating film charge storage layer.

2. Background Art

With the recent progress of downscaling, a NAND flash memory having a floating gate involves the problem of noticeable interference between adjacent memory cells due to the thickness of the floating gate itself as well as the difficulty in burying an insulating film between the cells.

To avoid such problems specific to floating gate flash memories, a so-called MONOS flash memory is proposed (e.g., JP-A 2005-011490(Kokai) and US Patent Application Publication No. 2005/0006698). "MONOS" is an abbreviation for the "metal-oxide (oxide film)-nitride (silicon nitride film)-oxide (oxide film)-silicon" structure. It is characterized in that the data memory state is changed by causing discrete traps existing in the charge storage layer such as a silicon nitride film to capture charges. Like the oxide film, the charge storage layer is also an insulating film and allows thin film formation. Hence the above problems occurring in floating gate flash memories can be resolved. The number of discrete traps and the depth of the traps in the charge storage layer affect the capturing efficiency and charge retention capability at the time of charge injection. Hence, besides the silicon nitride film, application of a metal oxide film and the process condition therefor are under development.

In a MONOS flash memory, charges are captured by discrete traps. Hence the data memory state depends on the position of the discrete traps and the position of the captured charges. Likewise, the charge capturing efficiency depends on the charge distribution in the charge storage layer before capturing the charges. Furthermore, in the charge retention state, the captured charges may be redistributed in the charge storage layer to change the data memory state.

However, the operation for changing the data memory state and reading the data used in the MONOS flash memory is similar to the operation in conventional floating gate flash memories. There has been no investigation on the method specific to the MONOS flash memory for electrically controlling the charge distribution in the charge storage layer. More specifically, there has been no investigation on how the charge capturing efficiency and the data memory state are affected by controlling the charge distribution in the charge storage layer, and the method for electrically controlling the charge distribution has yet to be established.

SUMMARY OF THE INVENTION

According to an aspect of the invention, there is provided a method for driving a nonvolatile semiconductor memory device having source/drain diffusion layers spaced from each other in a surface portion of a semiconductor substrate, a laminated insulating film formed on a channel between the source/drain diffusion layers and including a charge storage layer, and a gate electrode formed on the laminated insulating film, the nonvolatile semiconductor memory device changing its data memory state by injection of charges into the charge storage layer, the method including, before injecting charges to change the data memory state into the charge storage layer: injecting charges having a polarity identical to that of the charges to be injected; and further injecting charges having a polarity opposite to that of the injected charges.

According to another aspect of the invention, there is provided a method for driving a nonvolatile semiconductor memory device having source/drain diffusion layers spaced from each other in a surface portion of a semiconductor substrate, a laminated insulating film formed on a channel between the source/drain diffusion layers and including a charge storage layer, and a gate electrode formed on the laminated insulating film, the nonvolatile semiconductor memory device changing its data memory state by injection of electrons into the charge storage layer, the method including, before injecting electrons to change the data memory state into the charge storage layer: providing a first potential difference between the semiconductor substrate and the gate electrode so that the gate electrode has a higher potential than the semiconductor substrate; and subsequently providing a second potential difference between the semiconductor substrate and the gate electrode so that the gate electrode has a lower potential than the semiconductor substrate.

According to another aspect of the invention, there is provided a method for driving a nonvolatile semiconductor memory device having source/drain diffusion layers spaced from each other in a surface portion of a semiconductor substrate, a laminated insulating film formed on a channel between the source/drain diffusion layers and including a charge storage layer, and a gate electrode formed on the laminated insulating film, the nonvolatile semiconductor memory device changing its data memory state by injection of holes into the charge storage layer, the method including, before injecting holes as the charges to change the data memory state into the charge storage layer: providing a third potential difference between the semiconductor substrate and the gate electrode so that the semiconductor substrate has a higher potential than the gate electrode; and subsequently providing a fourth potential difference between the semiconductor substrate and the gate electrode so that the semiconductor substrate has a lower potential than the gate electrode.

According to another aspect of the invention, there is provided a method for driving a nonvolatile semiconductor memory device having source/drain diffusion layers spaced from each other in a surface portion of a semiconductor substrate, a laminated insulating film formed on a channel between the source/drain diffusion layers and including a charge storage layer, and a gate electrode formed on the laminated insulating film, the nonvolatile semiconductor memory device changing its data memory state by injection of charges into the charge storage layer, the method including: after injecting the charges into the charge storage layer, retaining the charges by providing a potential difference having a polarity corresponding to the injected charges between the semiconductor substrate and the gate electrode.

BRIEF DESCRIPTION OF THE DRAWINGS

FIGS. 4A to 4C are schematic views of the changes of charge distribution in the memory cell;

DETAILED DESCRIPTION OF THE INVENTION

The invention is applicable to nonvolatile semiconductor memory devices having memory cells composed of a laminated insulating film including a charge storage layer. Among them, the invention is suitable to the MONOS flash memory in that the MONOS flash memory allows thin film formation, that thin film formation can reduce interference between adjacent cells, and that the captured charges are resistant to releasing because insulating films (e.g. silicon oxide films) are formed above and below the charge storage layer. It is noted that the invention is also applicable to other memory cells composed of a laminated insulating film including a charge storage layer having discrete traps. For example, the invention is also widely applicable to memory cells having MNOS (metal-nitride-oxide-silicon), MONSNOS (metal-oxide-nitride-silicon-nitride-oxide-silicon) and other structures.

In the following, the invention is described in detail by taking an N-channel MONOS memory cell as an example. It is noted that the invention is not limited to the N-channel type, but is also applicable to the P-channel type. The latter case can be addressed by reversing the polarity of impurities in the source/drain or the semiconductor substrate and exchanging the voltages applied to the semiconductor substrate and the gate electrode.

Embodiments of the invention will now be described with reference to the drawings.

Embodiments of the invention related to a nonvolatile memory and a method for driving the same are described herein by taking an N-channel MONOS memory cell as an example.

Figure 1A:
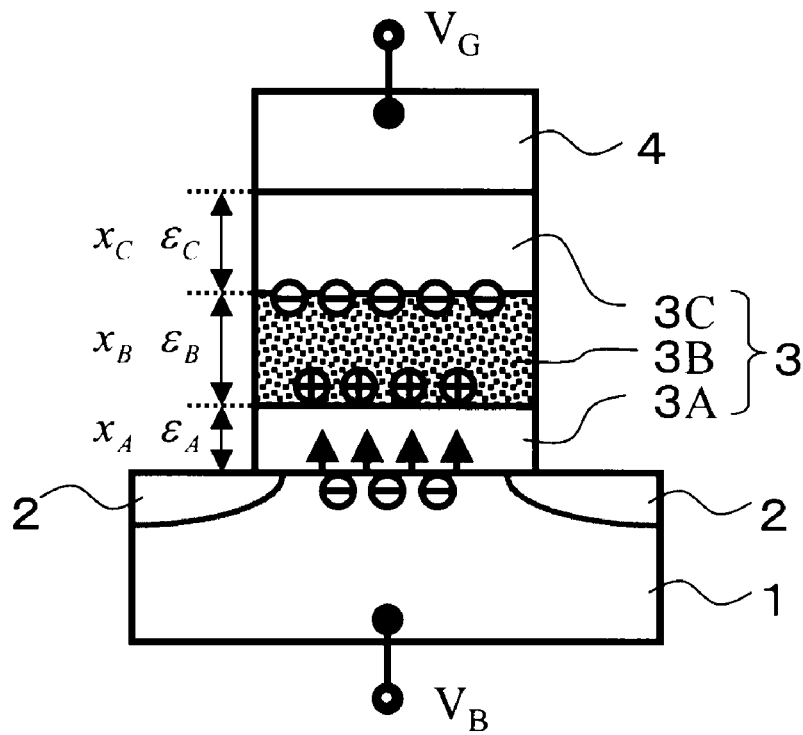
FIGS. 1A and 1B are schematic views of charge distribution in a MONOS memory cell.
Figure 1B:
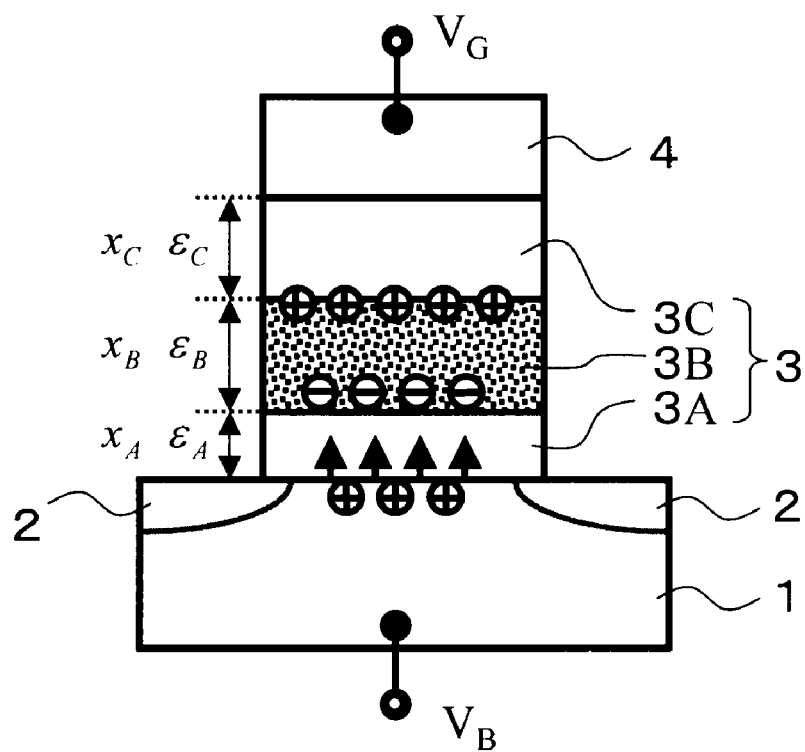

FIGS. 1A and 1B show schematic views of charge distribution in a MONOS memory cell formed by application of a method for driving a nonvolatile memory according to a first embodiment of the invention.

Figure 2:
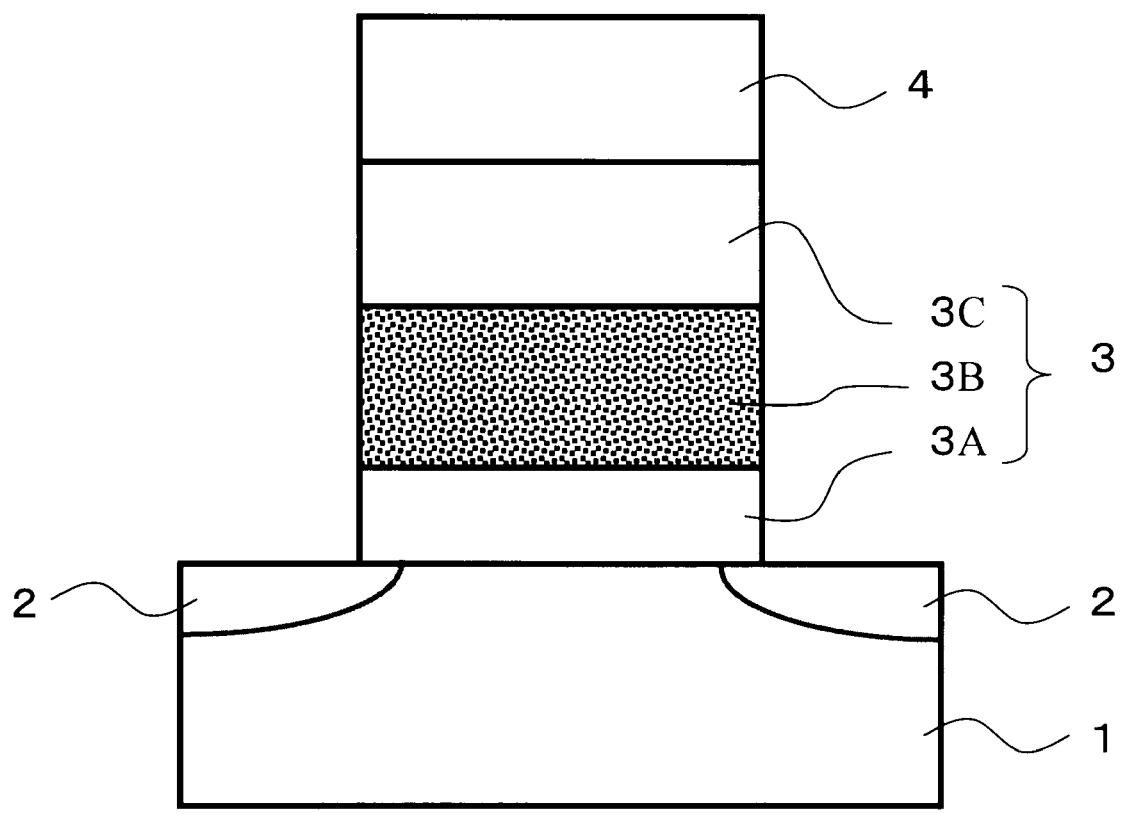
FIG. 2 is a cross-sectional view illustrating the structure of a MONOS memory cell to which this embodiment is applied.

FIG. 2 is a cross-sectional view illustrating the structure of a MONOS memory cell to which this embodiment is applied.

The MONOS memory cell shown in FIGS. 1 and 2 is formed on a semiconductor substrate 1 doped with P-type impurities. The term "semiconductor substrate" used herein includes a P-type well, a P-type semiconductor layer (e.g. SOI (silicon on insulator) layer), and a P-type polysilicon layer.

As shown in FIGS. 1A and 1B, a laminated insulating film 3 including a charge storage layer 3B is deposited on the semiconductor substrate 1. A gate electrode 4 is formed on the laminated insulating film 3. The charge storage layer 3B includes discrete traps and serves to capture injected charges. The discrete traps are spatially distributed in the charge storage layer, near the interface with the insulating film 3A on the semiconductor substrate 1 side, or near the interface with the insulating film 3C on the gate electrode 4 side. The charge storage layer is typically made of a silicon nitride film, but it can be replaced by a metal oxide film having a high density of discrete traps. Alternatively, the charge storage layer can also be made by laminating a plurality of materials having discrete traps. Likewise, the charge storage layer can be configured so as to include an insulating layer and/or a conductor layer having no discrete traps.

The charge storage layer can be made of various materials, including silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride aluminate (HfAlON), hafnium silicate (HfSiO), hafnium nitride silicate (HfSiON), lanthanum oxide ($La_2O_3$), and lanthanum aluminate ($LaAlO_3$). Furthermore, the charge storage layer can be based on various laminated structures such as NA, NH, NL, NAN, NHN, NLN, NHA, NAL, and AHL (all in no particular order), where "N" represents silicon nitride, "A" represents aluminum oxide, "H" represents a material containing hafnium as a primary element, and "L" represents a material containing lanthanum as a primary element.

The insulating film 3A and the insulating film 3C electrically insulate the charge storage layer 3B from the semiconductor substrate 1 or the gate electrode 4 and serve to confine charges in the charge storage layer 3B during charge retention. The effect of confining charges increases as the potential barrier of the insulating films 3A and 3C becomes higher with respect to the charge storage layer 3B. The insulating films 3A and 3C are typically made of silicon oxide, but it can be replaced by other materials if it has a potential barrier with respect to the charge storage layer 3B. The insulating films 3A and 3C can be made of various materials, including silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride aluminate (HfAlON), hafnium silicate (HfSiO), hafnium nitride silicate (HfSiON), lanthanum oxide ($La_2O_3$), and lanthanum aluminate ($LaAlO_3$).

The gate electrode 4 is formed on the laminated insulating film. A source/drain 2 is formed by ion implantation of N-type impurities into the semiconductor substrate 1 using the gate electrode 4 as a mask.

FIG. 1A shows the charge distribution formed before a program operation in this embodiment, and FIG. 1B shows the charge distribution formed before an erase operation in this embodiment.

When the charge distribution shown in FIG. 1A is formed, electron injection intended for retention is preceded by a program operation (A) and a subsequent erase operation (B). The sequence of steps including the program operation (A) and the erase operation (B) is hereinafter referred to as "preset 1". Here, by the first program operation (A), the discrete traps in the charge storage layer 3B are filled with electrons. By the next erase operation (B), holes are captured by some of the discrete traps in the charge storage layer 3B filled with electrons. Specifically, by the erase operation (B), holes are injected from the semiconductor substrate 1. At this time, the holes are captured near the interface of the charge storage layer 3B facing the semiconductor substrate 1. By the above program operation (A) and the subsequent erase operation (B), the charge distribution shown in FIG. 1A is formed in the charge storage layer 3B. That is, the charge distribution in the charge storage layer 3B is such that electrons are captured near the interface with the gate electrode 4 and holes are captured near the interface with the semiconductor substrate 1. This allows electrons to easily enter the substrate side of the charge storage layer 3B when a voltage for the program operation is applied to the gate electrode 4. That is, the efficiency of the program operation can be improved. The process is characterized in that the discrete traps in the charge storage layer 3B are not completely filled with holes by the erase operation (B).

Electron flows from a portion having a lower potential to a portion having a higher potential. Hole flows from a portion having a higher potential to a portion having a lower potential.

Figure 3A:
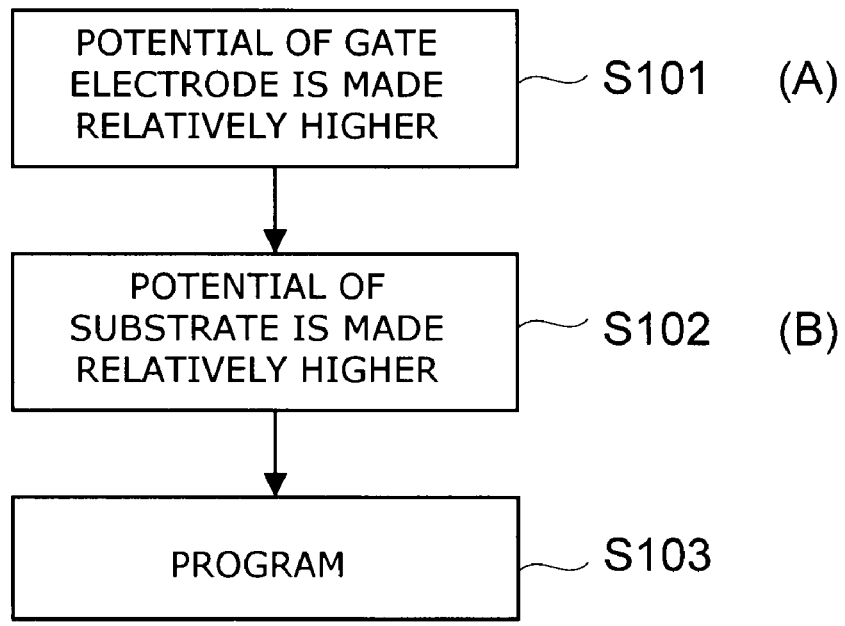
FIGS. 3A and 3B are process diagrams of the sequence of the method for driving a nonvolatile semiconductor device.
Figure 3B:
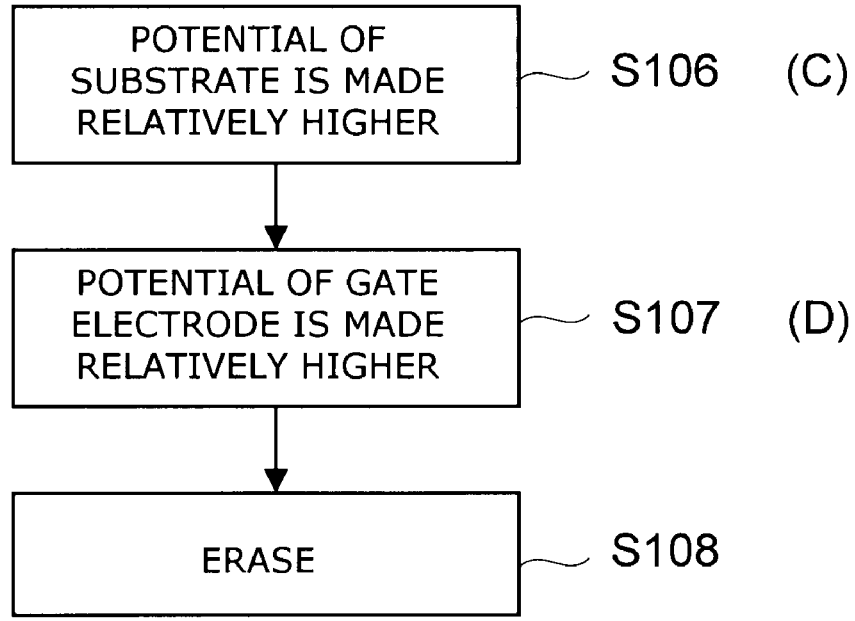

FIGS. 3A and 3B show process diagrams of the sequence of the method for driving a nonvolatile semiconductor device according to the first embodiment of the invention.

FIG. 3A shows the process of the driving method in the program operation. A potential difference is provided between the semiconductor substrate 1 and the gate electrode 4 so that the gate electrode 4 has a relatively higher potential than the semiconductor substrate 1 (step S101). Then a potential difference is provided between the semiconductor substrate 1 and the gate electrode 4 so that the semiconductor substrate 1 has a relatively higher potential than the gate electrode 4 (step S102). Subsequently, the program operation (step S103) is performed.

Step S101 corresponds to the program operation (A), and step S102 corresponds to the erase operation (B). These correspond to the preset 1 described above.

FIG. 3B shows the process of the driving method in the erase operation. A potential difference is provided between the semiconductor substrate 1 and the gate electrode 4 so that the semiconductor substrate 1 has a relatively higher potential than the gate electrode 4 (step S106). Then a potential difference is provided between the semiconductor substrate 1 and the gate electrode 4 so that the gate electrode 4 has a relatively higher potential than the semiconductor substrate 1 (step S107). Subsequently, the erase operation (step S108) is performed.

Step S106 corresponds to the erase operation (C), and step S107 corresponds to the program operation (D). These correspond to the preset 2 described below.

FIGS. 4A through 4C show schematic views of the changes of charge distribution in the memory cell in each step shown in FIG. 3A.

In step S101, as shown in FIG. 4A, the potential of the gate electrode 4 is made higher than that of the semiconductor substrate 1 to inject electrons into the charge storage layer 3B from the semiconductor substrate 1 side. In a memory cell array, electrons can be injected into all the memory cells collectively. In step S102, as shown in FIG. 4B, the potential of the semiconductor substrate 1 is made higher than that of the gate electrode 4 to inject holes into the charge storage layer 3B from the semiconductor substrate 1 side. This step can be also collectively performed on all the memory cells in the memory cell array. In step S103, as shown in FIG. 4C, by injecting electrons into the charge storage layer 3B, the program operation is performed on the memory cells with holes existing near the interface of the charge storage layer 3B facing the semiconductor substrate 1.

The voltage and application time used for the program operation (A) and the erase operation (B) depend on the dimension of the memory cell. The voltage and application time used vary with the generations of memory cells, and hence are arbitrary. However, in setting the voltage used for the program operation (A) and the erase operation (B), electrical damage to the insulating film 3A needs to be taken into consideration. Preferably, electric field applied to the insulating film 3A is 20 MV/cm or less. More preferably, for rapid operation at low voltage, electric field applied to the insulating film 3A is 15 MV/cm or less, and the application time is 10 seconds or less.

A description is given of the effect of electron injection on the threshold at the time of formation of the above charge distribution. Let $V_{FB}$ be the flat band voltage of the memory cell in the above charge distribution. When a gate voltage $V_G$ is applied to the gate electrode 4, the following electric field is applied to the insulating film 3A:

$$E = \frac{V_G - V_{FB} - \varphi_S}{T} \quad (1)$$

where $\phi_s$ is the surface potential of the semiconductor substrate 1, and T is the equivalent oxide thickness (hereinafter abbreviated as EOT) of the overall memory stack. Let J(E) be the electron current injected from the semiconductor substrate by the electric field of equation (1). Then the amount of charge injected in an infinitesimal time $\Delta t$ is $J(E)\Delta t$.

In the state of charge distribution of FIG. 1A, if electrons are injected from the semiconductor substrate 1, the discrete traps near the interface of the charge storage layer 3B facing the gate electrode 4 capture no more electrons because they have already been filled with electrons. In contrast, the neighborhood of the interface of the charge storage layer 3B facing the semiconductor substrate 1 is filled with holes, and hence can capture electrons. If the amount of charge $J(E)\Delta t$ injected by application of the above gate voltage $V_G$ to the gate electrode 4 is captured by the neighborhood of the interface of the charge storage layer 3B facing the semiconductor substrate 1, the threshold varies by the following amount:

$$\Delta V_{TH} = \frac{1}{\varepsilon_0}\left(\frac{x_B}{\varepsilon_B} + \frac{x_C}{\varepsilon_C}\right)J(E)\Delta t \quad (2)$$

where q is the elementary charge, $\varepsilon_0$ is the dielectric constant of the vacuum, $x_B$ and $\varepsilon_B$ are the thickness and relative dielectric constant of the charge storage layer 3B, respectively, and $x_C$ and $\varepsilon_C$ are the thickness and relative dielectric constant of the insulating film 3C, respectively. The threshold variation varies with program time in accordance with equation (2).

Figure 5:
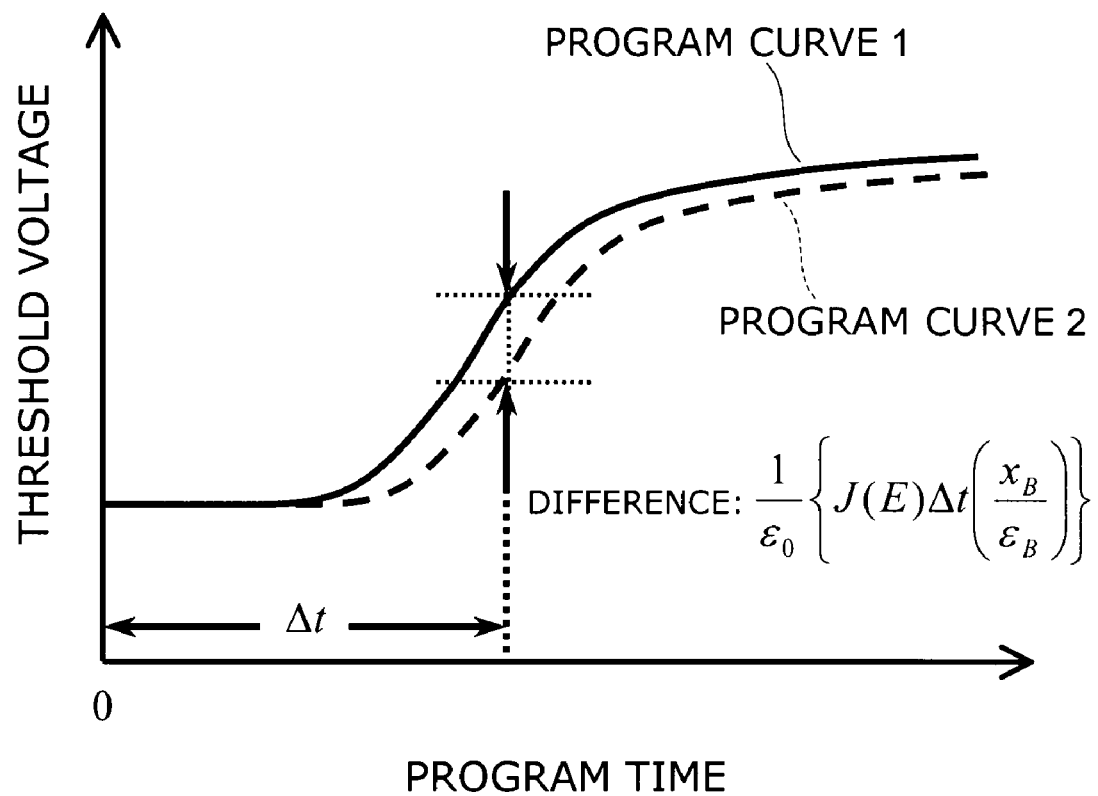
FIG. 5 is a graph showing the temporal variation of the threshold according to the embodiment.

FIG. 5 is a graph schematically showing the temporal variation of the threshold according to the first embodiment.

The threshold variation in accordance with equation (2) is represented by the program curve 1 of FIG. 5.

For comparison purposes, reference is made to the charge distribution of FIG. 1B. In FIG. 1B, in the charge storage layer 3B, the discrete traps near the interface with the semiconductor substrate 1 are filled with electrons, and the discrete traps near the interface with the gate electrode 4 are filled with holes. Such a charge distribution is formed by an erase operation (C) and a subsequent program operation (D). The sequence of steps including the erase operation (C) and the program operation (D) is hereinafter referred to as "preset 2".

Let $V_{FB}$ be the flat band voltage of the memory cell in the above charge distribution. Then the amount of charge injected by application of the gate voltage $V_G$ to the gate electrode 4 is also $J(E)\Delta t$. The injected electrons are located near the interface of the charge storage layer 3B facing the gate electrode 4. The threshold variation resulting from the electron injection is given by, at time t:

$$\Delta V_{TH} = \frac{1}{\varepsilon_0}\left(\frac{x_C}{\varepsilon_C}\right)J(E)\Delta t \qquad (3)$$

The threshold variation in accordance with equation (3) is represented by the program curve 2 of FIG. 5. On comparison between equations (2) and (3), equation (2) is higher by $(q/\varepsilon_0)(x_B/\varepsilon_B)J(E)\Delta t$. Equations (2) and (3) reflect two extreme characteristics of the charge distribution. Hence, depending on the voltage value and application time of the voltage used in the preset 1 and the preset 2, the preset 1 does not always have a larger threshold variation than the preset 2 by $(q/\varepsilon_0)J(E)\Delta t(x_B/\varepsilon_B)$. However, the program speed after the execution of the preset 1 is always higher than the program speed after the execution of the preset 2.

By the erase operation (B), holes are injected into the interface of the charge storage layer 3B facing the semiconductor substrate 1. This facilitates entrance of electrons at the program time. The threshold variation is affected by the distance from the electrode. Hence how the threshold varies is affected by the charge variation at the interface with the semiconductor substrate 1, which is located far from the gate electrode 4. That is, in the injection of electrons into the charge storage layer 3B in the program operation, the charge distribution of FIG. 1A has an effect of increasing the program speed by the amount corresponding to the thickness of the charge storage layer 3B as compared with the charge distribution of FIG. 1B.

Figure 6:
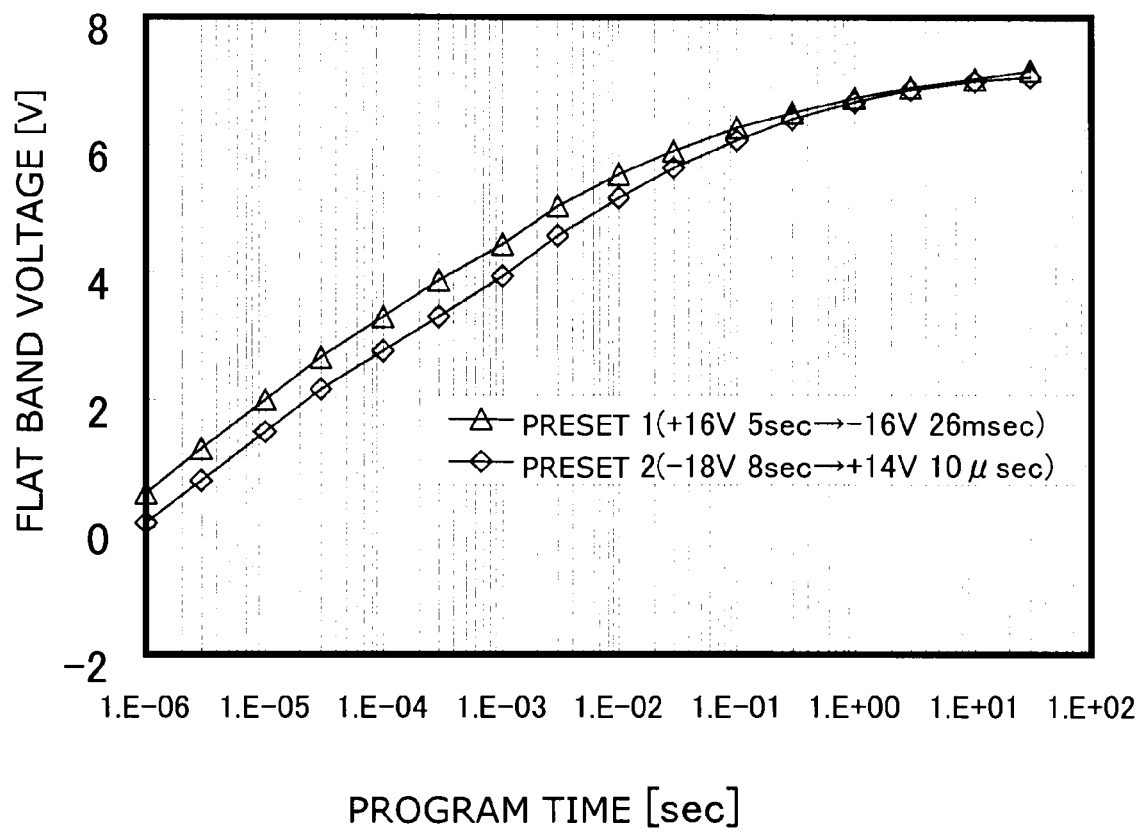
FIG. 6 is a graph showing the results characterizing the program operation characteristics.

FIG. 6 is a graph characterizing the program operation characteristics.

The increase of flat band voltage is plotted on the vertical axis versus the program time. For purposes of comparison between the effects of the preset 1 and the preset 2, the preset 1 and the preset 2 were applied to a MONOS memory cell in which the insulating film 3A is a silicon oxide film having a thickness of 4 nm, the charge storage layer 3B is a silicon nitride film having a thickness of 5 nm, and the insulating film 3C is made of alumina having a thickness of 15 nm (the memory cell having this thickness configuration being hereinafter referred to as memory cell 1). FIG. 6 shows the characterization of the program operation in this setup. The result under the preset 1 is represented by the mark $\Delta$, and result under the preset 2 is represented by the mark $\Diamond$. Here, under the preset 1, the voltage value and application time of the voltage for the program operation (A) were 16 V and 5 seconds, respectively, and the voltage value and application time of the voltage for the erase operation (B) were 16 V and 26 milliseconds, respectively. It is noted that FIG. 6 shows the relative potential of the gate electrode 4 with respect to the semiconductor substrate 1. Under the preset 2, the voltage value and application time of the voltage for the erase operation (C) were 18 V and 8 seconds, respectively, and the voltage value and application time of the voltage for the program operation (D) were 14 V and 10 microseconds, respectively. As seen from FIG. 6, a higher flat band voltage is attained for the same program time under the preset 1 than under the preset 2. That is, it turns out that the program speed under the preset 1 is higher than the program speed under the preset 2.

It is easily understood that the charge polarity of the charge distribution for enhancing the erase speed is opposite to that of the charge distribution for enhancing the program speed. That is, as shown in FIG. 1B, in the charge storage layer 3B of the former charge distribution, the discrete traps near the interface with the semiconductor substrate 1 are filled with electrons, and the discrete traps near the interface with the gate electrode 4 are filled with holes. Such a charge distribution is formed by performing the preset 2 before the injection of holes for threshold variation. The amount of threshold variation after the execution of the preset 2 surpasses the amount of threshold variation after the execution of the preset 1 by $(q/\varepsilon_0)J(E)\Delta t(x_B/\varepsilon_B)$.

It is noted that the voltage pulse used for the preset 1 or the preset 2 may be a combination of a plurality of voltage pulses. The combination needs to satisfy the following requirements: all the applied voltages need to have the same polarity, and the threshold needs to reach an intended threshold after application of the pulses.

Figure 7A:
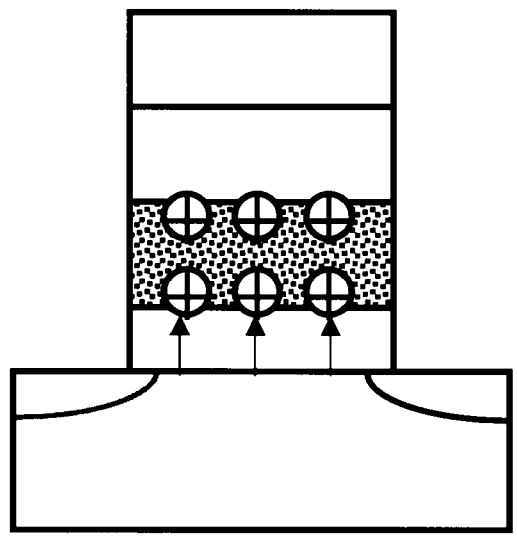
FIGS. 7A to 7C are schematic views of the changes of charge distribution in the memory cell.
Figure 7B:
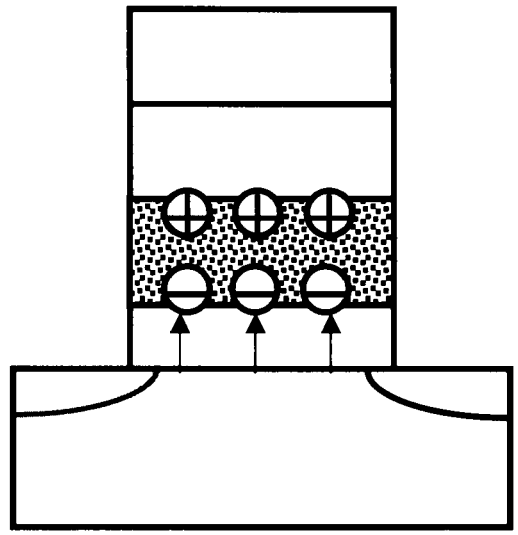
Figure 7C:
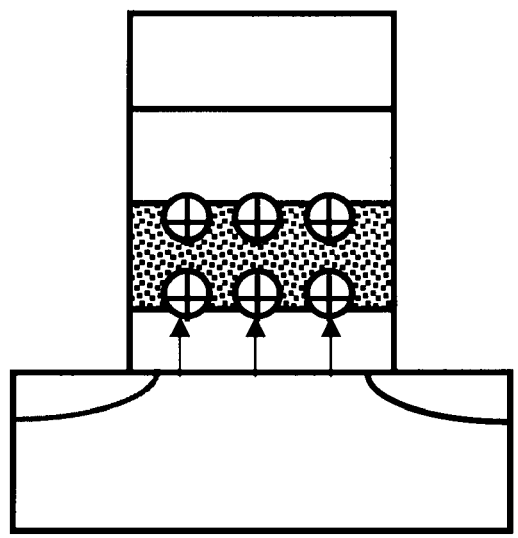

FIGS. 7A through 7C show schematic views of charge distribution in the memory cell in each step shown in FIG. 3B.

In step S106, as shown in FIG. 7A, the potential of the semiconductor substrate 1 is made higher than that of the gate electrode 4 to inject holes into the charge storage layer 3B from the semiconductor substrate 1 side. In a memory cell array, holes can be injected into all the memory cells collectively. In step S107, as shown in FIG. 7B, the potential of the gate electrode 4 is made higher than that of the semiconductor substrate 1 to inject electrons into the charge storage layer 3B from the semiconductor substrate 1 side. This can be also collectively performed on all the memory cells in the memory cell array. In step S108, as shown in FIG. 7C, by injecting holes, the erase operation is performed on the memory cells with electrons existing near the interface of the charge storage layer 3B facing the semiconductor substrate 1.

The collective program and the collective erase operation described above do not need to be performed each time immediately before the program or erase operation, but only need to be performed at power-on, for example. Subsequently, the individual program or erase operation may be performed.

Figure 8:
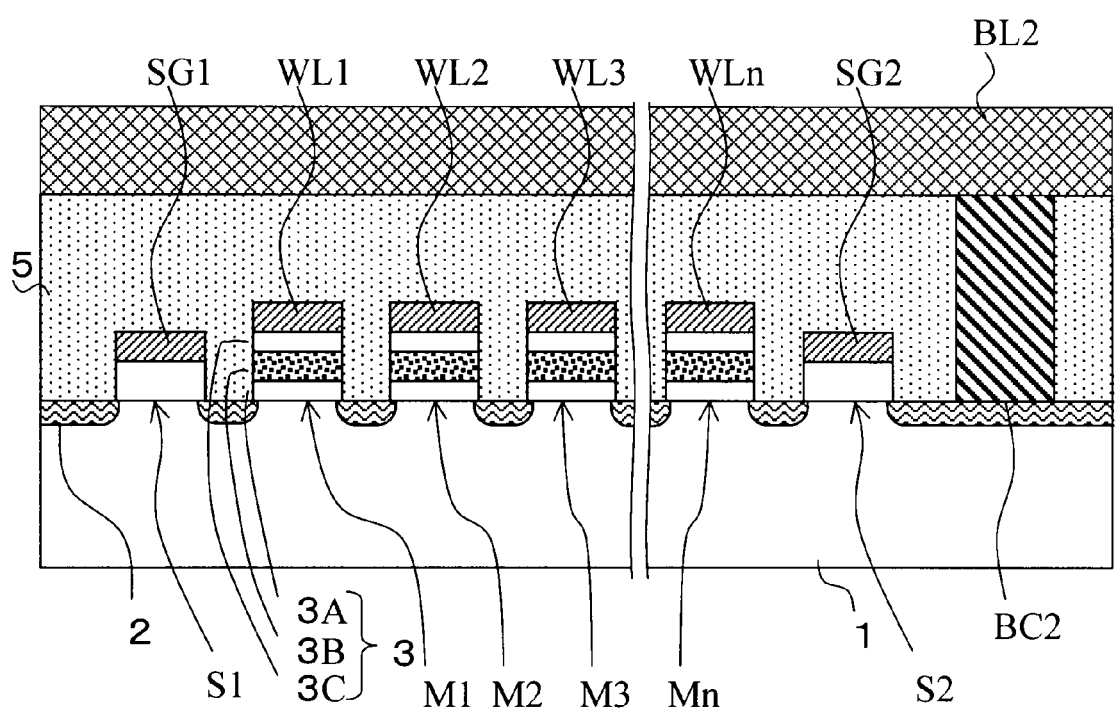
FIG. 8 is a cross-sectional view illustrating the cross-section of a NAND string in the column direction.

FIG. 8 is a cross-sectional view of a NAND string in the column direction. A plurality of MONOS memory cells (M1-Mn) are arranged on the semiconductor substrate 1. The gate electrode of each memory cell is in electrical contact with the adjacent NAND string and referred to as word line WL1-WLn. A source/drain region 2 is formed in the surface of the semiconductor substrate 1 below the portion between the word lines.

A first and second select transistor S1, S2 are made of a normal MOSFET. The gate electrodes of the select transistors S1, S2 constitute a first select gate SG1 and a second select gate SG2, respectively.

An interlayer insulating film 5 (e.g. silicon dioxide) is thickly deposited on the MONOS memory cells and the select transistors.

A bit line BL2 is connected through a bit contact BC2 to the source/drain region 2 adjacent to the select transistor S2. Likewise, a bit line BL1 is connected through a bit contact BC1 to the source/drain region 2 adjacent to the select transistor S1. The bit contact BC1 and the bit line BL1 are not shown.

In the MONOS memory cell of this embodiment, electron injection for varying the threshold is preceded by a program operation and a subsequent erase operation, thereby enhancing the program speed. In particular, in the case of a P-type semiconductor substrate 1, a plurality of NAND strings are connected to each other through word lines WL1-WLn. Hence the erase operation is performed on the plurality of memory cells by applying a positive erase voltage to the semiconductor substrate with the word lines being held at 0 V. Thus it is suitable to apply this embodiment collectively to a plurality of NAND strings connected through word lines before the program operation intended for retention. It is noted that in a NAND memory, a program-verify operation (T. Tanaka, Y. Tanaka, H. Nakamura, H. Oodaira, S. Aritome, R. Shirota, and F. Masuoka, "A Quick Intelligent Programming Architecture 3V-Only NAND-EEPROMs", Symp. VLSI Circuit Dig. Tech. Papers, pp. 20-21, June (1992)) is typically used for controlling the threshold distribution resulting from variations in the memory cells. The present embodiment is suitably used immediately before the program-verify operation.

Figure 9A:
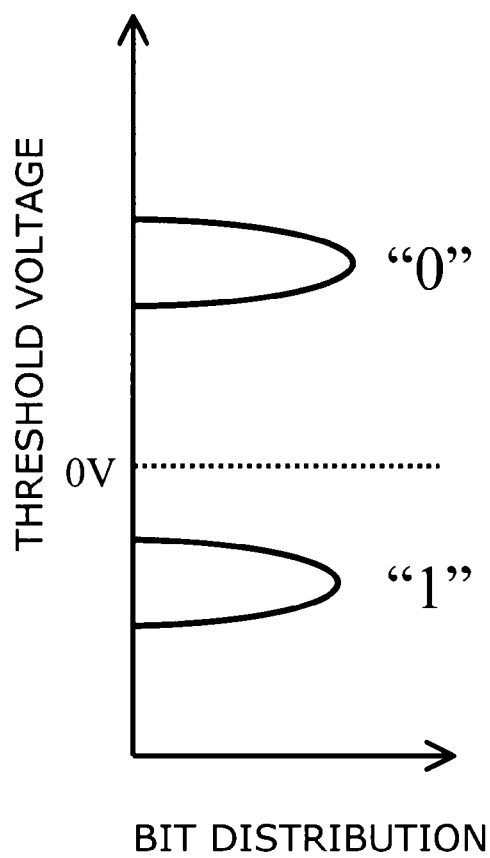
FIGS. 9A and 9B are schematic views for illustrating the threshold distribution and the definition of the threshold level.
Figure 9B:
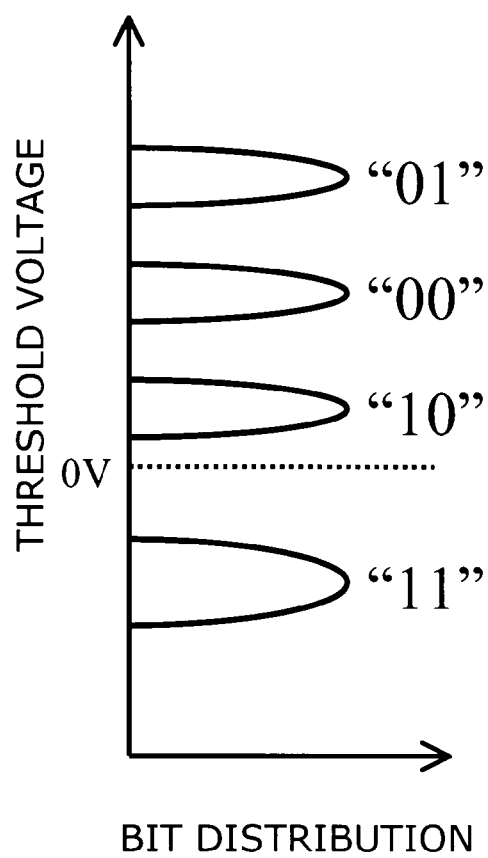

FIGS. 9A and 9B show schematic views for illustrating the threshold distribution and the definition of the threshold level of the NAND memory.

FIG. 9A shows a threshold distribution of a binary memory cell. This embodiment is suitably used before the program operation from the "1" level to the "0" level. FIG. 9B shows a threshold distribution of a quaternary memory cell. There are four levels of "11", "10", "00", and "01", and this embodiment can be used before the program operation between any pair of levels. However, under the condition that the erase operation is collectively performed, this embodiment is most suitably used before the program operation from the "11" level to the "10" level.

In another aspect of this embodiment, hole injection for varying the threshold is preceded by an erase operation and a subsequent program operation, thereby enhancing the erase speed. As described above, in the case of using a NAND memory cell, collective use of this embodiment is not efficient because the erase operation becomes redundant. Hence this embodiment is suitably used in another memory cell having an opposite polarity. That is, it is desirable to reverse the polarity of impurities in the source/drain or the semiconductor substrate and to exchange the voltages applied to the semiconductor substrate and the gate electrode.

Next, a method for operating a NAND string is described. As shown in FIG. 8, in a NAND memory, a NAND string is connected through word lines WL1-WLn to the adjacent NAND string. Hence it is suitable to apply this embodiment collectively to a plurality of NAND strings.

Figure 10A:
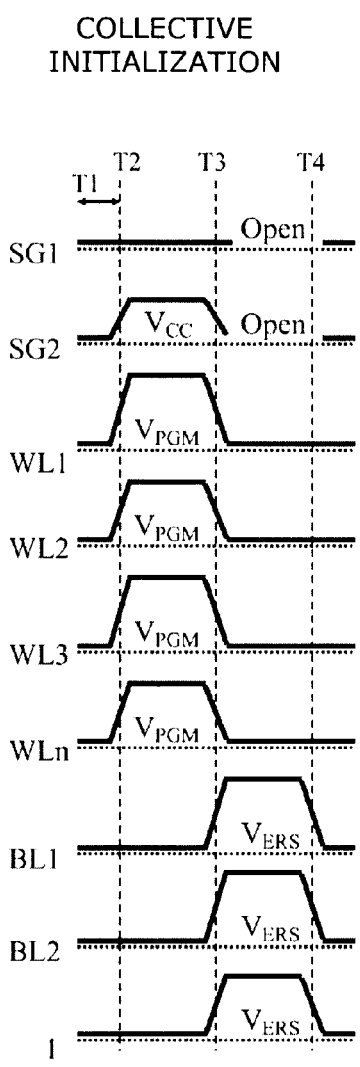
FIGS. 10A to 10C are time charts of the method for operating a NAND string.
Figure 10B:
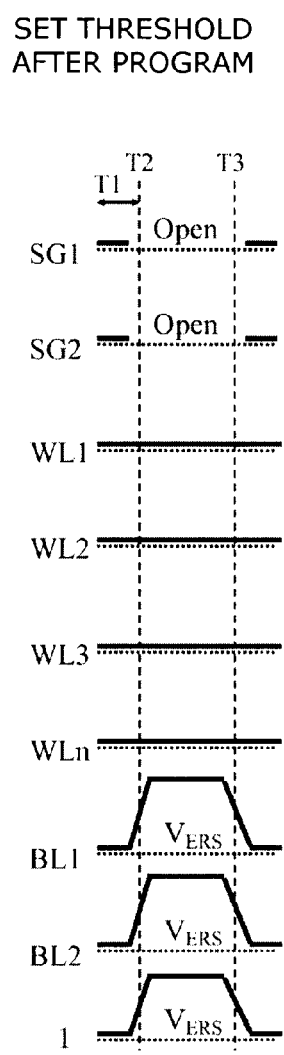
Figure 10C:
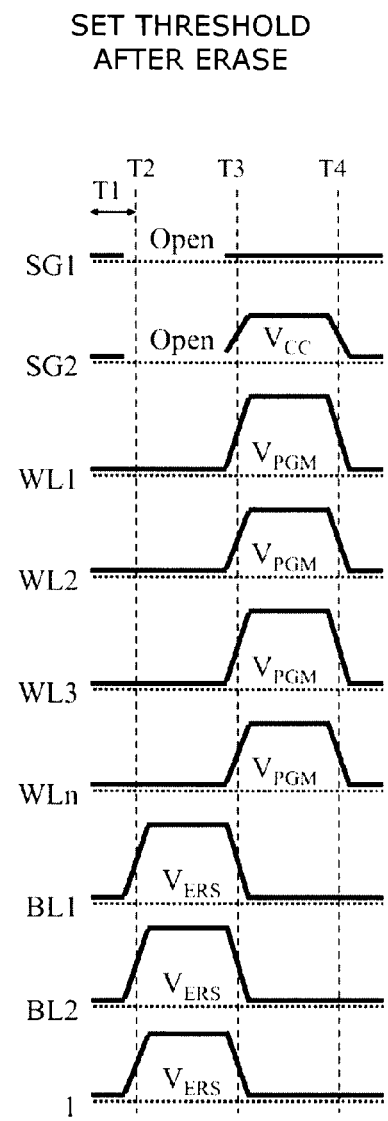

FIGS. 10A through 10C illustrate time charts of the method for operating a NAND string.

Specifically, FIG. 10A shows a time chart of collective initialization. The preset 1 is performed in accordance with this time chart. First, a program-verify operation is completed during time T1. Then the program operation (A) is performed during the time interval T2-T3. In the program operation (A), with the potential of the bit line BL2 held at 0 V, a voltage of approximately 5 V is applied to the select gate SG2 to turn the select transistor S2 into the conducting state. Furthermore, a program voltage $V_{PGM}$ used for the program operation is applied to the word lines WL1-WLn. Next, the erase operation (B) is performed during the time interval T3-T4. In the erase operation (B), with the potential of the word lines WL1-WLn held at 0 V, an erase voltage $V_{ERS}$ is applied to the semiconductor substrate 1. Electron injection for varying the threshold is to be performed after time T4.

Besides NAND memory cells, this embodiment is applicable to any other memory cells having a charge storage layer including discrete traps. For example, also in a NOR memory cell, the preset 1 can be used to control the charge distribution in the charge storage layer and to speed up the variation of threshold voltage by charge injection.

Next, a second embodiment of the invention is described.

Here, a description is given of the enhancement of retention characteristics in the case of injecting electrons. Specifically, in order to enhance retention characteristics, electron injection for varying the threshold is followed by an erase operation (E).

Figure 11:
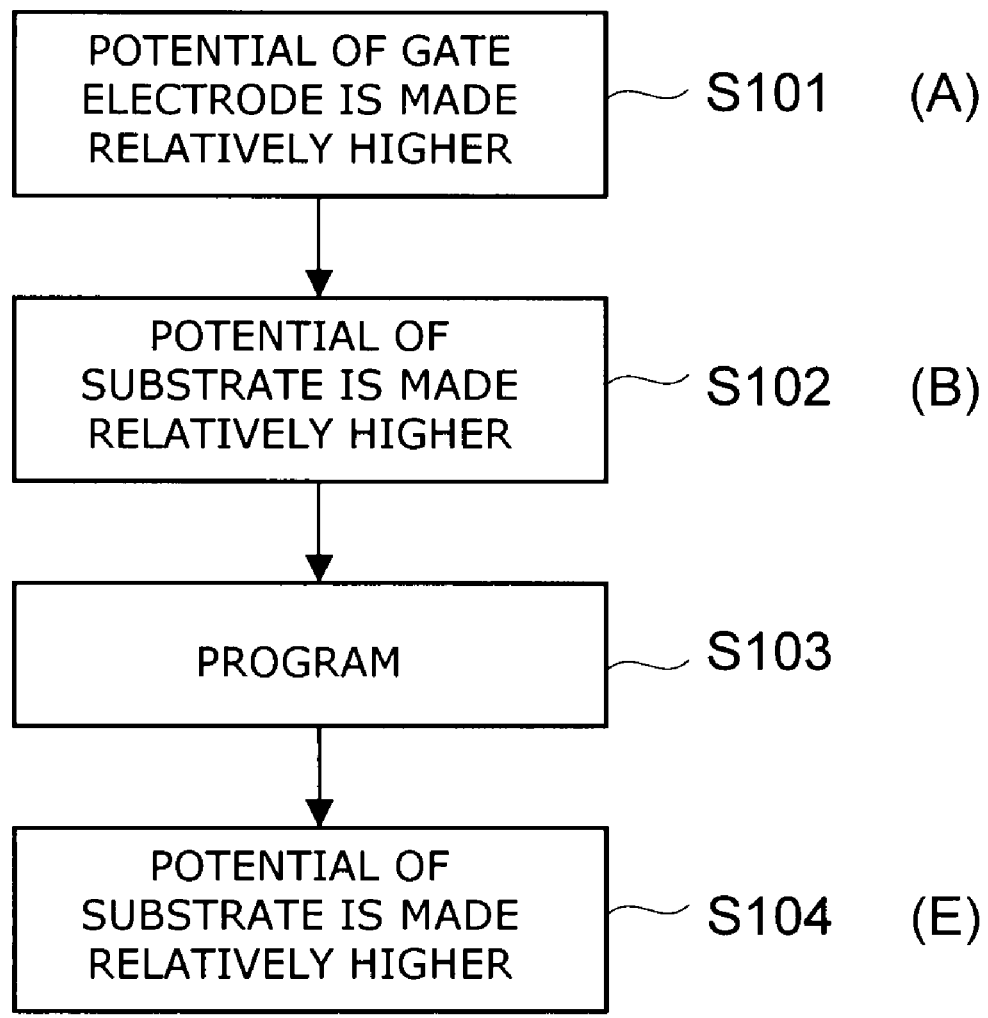
FIG. 11 is a process diagram showing the sequence of a method for driving a nonvolatile semiconductor memory device.

FIG. 11 is a process diagram showing the sequence of a method for driving a nonvolatile semiconductor memory device according to this embodiment.

In this embodiment, in addition to steps S101 to step S103 shown in FIG. 3A, the potential of the semiconductor substrate 1 is made higher than that of the gate electrode 4 in step S104 in order to enhance the retention characteristics for electrons injected in step S103. This corresponds to the erase operation (E).

In the following, a description is given of the enhancement of electron retention characteristics resulting from hole injection in this erase operation (E).

FIG. 10B shows a time chart for setting the threshold after a program operation. The erase operation (E) on the NAND string of FIG. 8 is performed in accordance with this time chart. Electron injection is completed during time T1. The threshold reached by a memory cell M1, for example, as a consequence of the electron injection is denoted by $V_{TH,1}$. Then the erase operation (E) is performed during the time interval T2-T3. Specifically, with the potential of the word lines WL1-WLn held at 0 V, an erase voltage $V_{ERS}$ used for the erase operation is applied to the semiconductor substrate 1. Let $\Delta V_{TH,1}$ be the amount of threshold variation resulting from the erase operation (E). Consequently, the threshold of the memory cell M1 becomes:

$$V_{TH,2}=V_{TH,1}-\Delta V_{TH,1} \qquad (4)$$

After time T3, charge retention continues until the next charge injection is performed.

In setting the voltage used for the erase operation (E), electrical damage to the insulating film 3A needs to be taken into consideration. Preferably, electric field applied to the insulating film 3A is 20 MV/cm or less. More preferably, for rapid operation at low voltage, electric field applied to the insulating film 3A is 15 MV/cm or less, and the application time is 10 seconds or less.

The charge distribution in the charge storage layer 3B after the execution of the erase operation (E) is described with reference to FIG. 2. First, if a sufficient amount of electrons are injected during time T1, the discrete traps in the charge storage layer 3B are populated with electrons at high density. Then, upon the execution of the erase operation (E), some of the discrete traps in the charge storage layer 3B are filled with holes. Specifically, by the erase operation (E), holes are injected from the semiconductor substrate 1. At this time, the holes are captured near the interface of the charge storage layer 3B facing the semiconductor substrate 1. By the above electron injection and the subsequent erase operation (E), the charge distribution shown in FIG. 1A is formed in the charge storage layer 3B. That is, the charge distribution in the charge storage layer 3B is such that electrons are captured near the interface with the gate electrode 4 and holes are captured near the interface with the semiconductor substrate 1.

By way of example, a charge distribution immediately after the completion of the erase operation (E) is assumed such that, in the charge storage layer 3B, holes exist at the interface with the semiconductor substrate 1 at a density of $N_H$ [cm$^{-2}$], and electrons exist at the interface with the gate electrode 4 at a density of $N_E$ [cm$^{-2}$]. Then the threshold of equation (4) is expressed as:

$$V_{TH,2} = \frac{q}{\varepsilon_0}\left\{N_E\left(\frac{x_C}{\varepsilon_C}\right) - N_H\left(\frac{x_B}{\varepsilon_B} + \frac{x_C}{\varepsilon_C}\right)\right\} \quad (5)$$

where $N_E$ and $N_H$ are defined so as to satisfy $V_{TH,2}>0$. Subsequently, in the process of charge retention, electrons and holes are redistributed, or recombined. The maximum of threshold variation is presented below in the case where charges are redistributed and in the case where electrons and holes are recombined with the charge distribution remaining unchanged.

In the case where charges are redistributed, the threshold variation is maximized when, in the charge storage layer 3B, electrons captured at the interface with the gate electrode 4 migrate to the interface with the semiconductor substrate 1 and holes captured at the interface with the semiconductor substrate 1 migrate to the interface with the gate electrode 4. The threshold upon completion of the redistribution is given by:

$$V_{TH,3} = \frac{q}{\varepsilon_0}\left\{N_E\left(\frac{x_B}{\varepsilon_B} + \frac{x_C}{\varepsilon_C}\right) - N_H\left(\frac{x_C}{\varepsilon_C}\right)\right\} \quad (6)$$

The variation from the threshold immediately after charge injection (equation (5)) is given by:

$$V_{TH,3} - V_{TH,2} = \frac{q}{\varepsilon_0}\left\{(N_E + N_H)\left(\frac{x_B}{\varepsilon_B}\right)\right\} \quad (7)$$

As seen from equation (7), by charge redistribution, the threshold becomes higher than that immediately after charge injection.

In the case where electrons and holes are recombined with the charge distribution remaining unchanged, the threshold variation is maximized when, in the charge storage layer 3B, all the holes captured at the interface with the semiconductor substrate 1 are recombined with electrons captured at the interface with the gate electrode 4. Upon completion of the recombination, no holes exist in the charge storage layer 3B, and electrons exist at a density of $N_E - N_H$ [cm$^{-2}$] on the gate electrode 4 of the charge storage layer 3B. At this time, the threshold is given by:

$$V_{TH,4} = \frac{q}{\varepsilon_0}\left\{(N_E - N_H)\left(\frac{x_C}{\varepsilon_C}\right)\right\} \quad (8)$$

The variation from the threshold immediately after charge injection (equation (5)) is given by:

$$V_{TH,4} - V_{TH,2} = \frac{q}{\varepsilon_0}\left\{N_H\left(\frac{x_B}{\varepsilon_B}\right)\right\} \quad (9)$$

As seen from equation (9), by electron-hole recombination, the threshold becomes higher than that immediately after charge injection.

Figure 12:
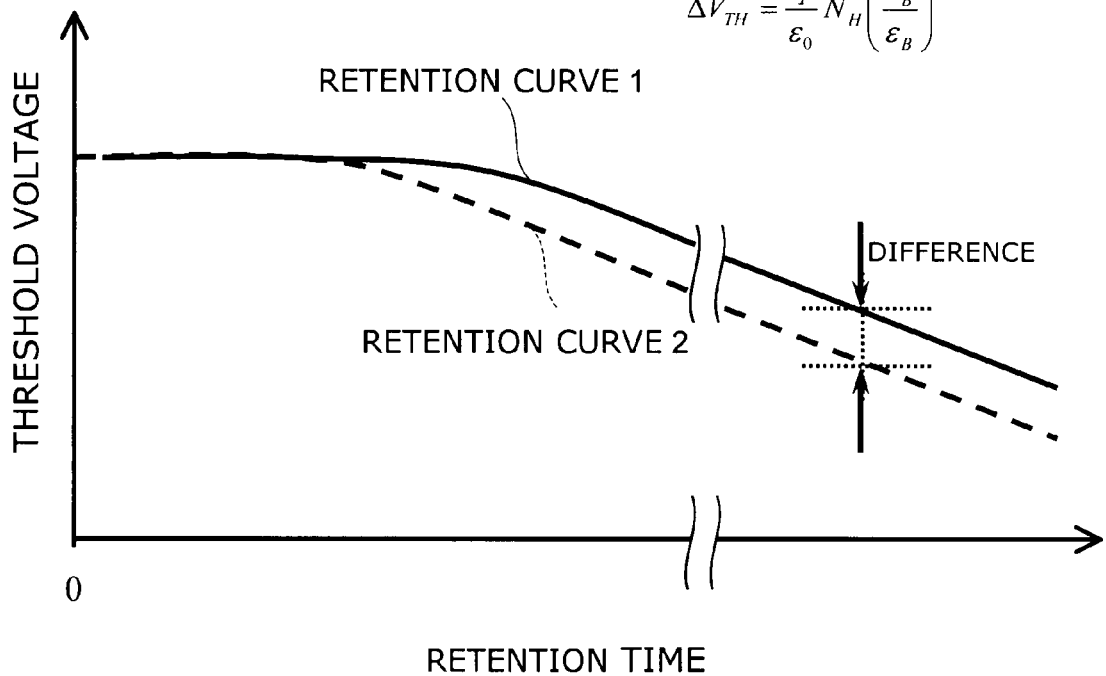
FIG. 12 is a graph schematically showing the retention characteristics of the threshold voltage.

FIG. 12 is a graph schematically showing the retention characteristics of the threshold voltage.

In the actual process of charge retention, charges in the charge storage layer 3B are released through the insulating film 3A or the insulating film 3C to the semiconductor substrate 1 or the gate electrode 4. Release of charges results in attenuating the threshold. In particular, release of electrons is the main cause of the threshold attenuation.

In this embodiment, the erase operation (E) performed after electron injection can facilitate charge redistribution or electron-hole recombination in the process of charge retention. The charge redistribution or the electron-hole recombination has an effect of preventing the threshold attenuation due to release of charges. As compared with the case without the erase operation (E), the threshold difference in the case of charge redistribution is given by equation (7), and the threshold difference in the case of electron-hole recombination is given by equation (9). These are both shown in FIG. 12.

The erase operation (E) performed after electron injection results in the retention characteristics of the threshold as represented by the retention curve 1 of FIG. 12. The retention curve 1 represents both cases in the process of charge retention, i.e., the case where charges are redistributed and the case where electrons and holes are recombined. On the other hand, the retention curve 2 of FIG. 12 represents retention characteristics in the case where the erase operation (E) after electron injection is omitted. As described above, the erase operation (E) performed after electron injection enhances the retention characteristics of the threshold.

When charge redistribution or electron-hole recombination occurs in the charge storage layer 3B, the threshold variation is affected more greatly by variation of charges located far from the gate electrode 4 because the threshold variation is determined by the product of distance and charge. Holes injected by the erase operation (E) at the interface between the charge storage layer 3B and the insulating film 3A vanish by redistribution or recombination, and this effect of vanishing greatly serves to increase the threshold. Consequently, in balance with the threshold variation due to vanishing of negative charges, the threshold tends to be maintained. Conventionally, only electrons are injected into the charge storage layer 3B by the program operation, and the electrons are released during retention, attenuating the threshold. In contrast, the process of the invention corresponds to a stronger program operation followed by slight release of electrons.

Figure 13:
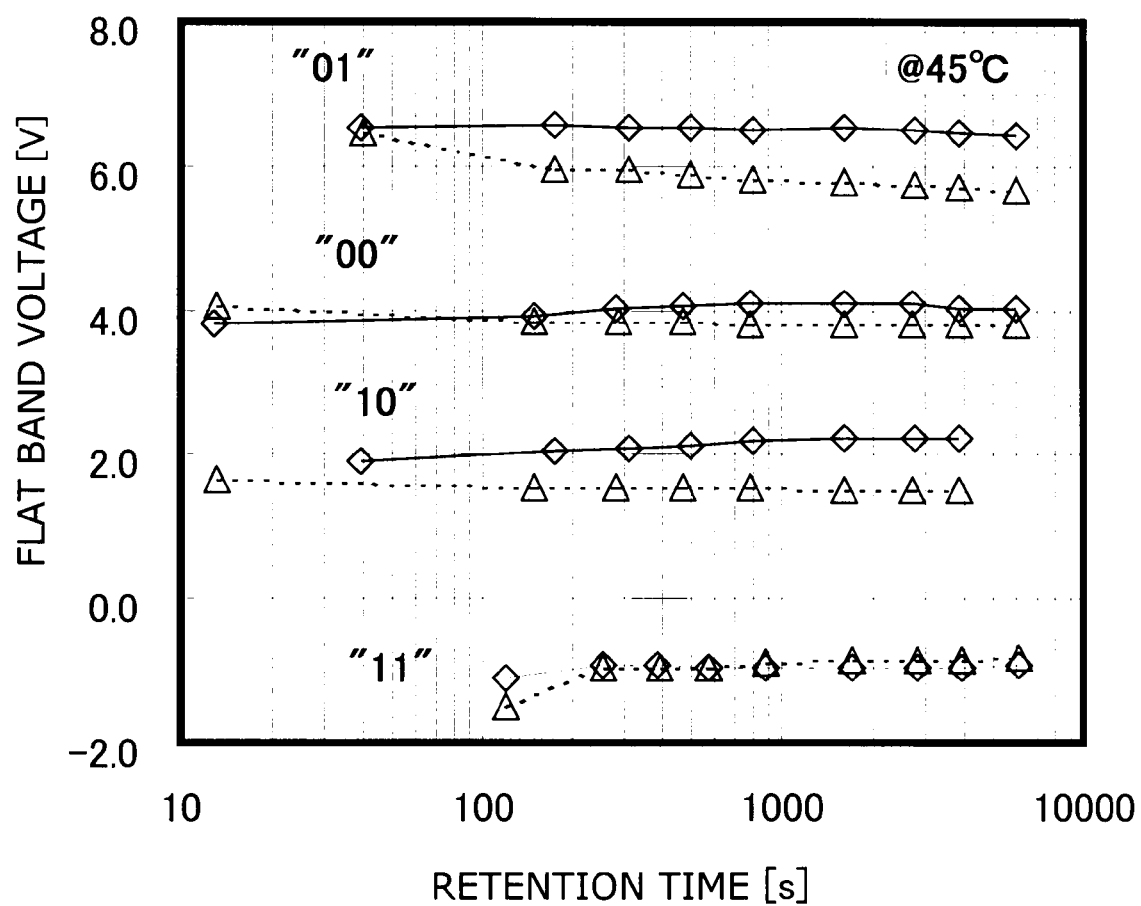
FIG. 13 is a graph showing the results characterizing the retention characteristics.

FIG. 13 is a graph showing the data characterizing the retention characteristics.

The flat band voltage is plotted on the vertical axis versus the retention time. The enhancement of retention characteristics is indicated by the stability of the flat band voltage. For the purpose of demonstrating the effect of the erase operation (E) on the retention characteristics, the erase operation (E) was performed on a MONOS memory cell in which the insulating film 3A is a silicon oxide film having a thickness of 4 nm, the charge storage layer 3B is a silicon nitride film having a thickness of 5 nm, and the insulating film 3C is made of a laminated film of alumina and a silicon nitride film having a thickness of 15 nm and 2 nm, respectively (the memory cell having this thickness configuration being hereinafter referred to as "memory cell 2"). The result of characterizing the retention characteristics in this setup is represented by the mark ◇ in FIG. 13. In forming the program levels "10", "00", and "01" in FIG. 13, once a program operation was performed, different erase operations (E) were performed, respectively. Specifically, the voltage value and the application time of the erase operation (E) for forming the program level "10" were 20 V and 2 milliseconds, respectively. The voltage value and the application time of the erase operation (E) for forming the program level "00" were 20 V and 0.5 milliseconds, respectively. The voltage value and the application time of the erase operation (E) for forming the program level "01" were 20 V and 35 microseconds, respectively. The result of characterizing the retention characteristics without the erase operation (E) is represented by the mark Δ. As seen from FIG. 13, retention with the erase operation (E) being performed has higher retention characteristics than retention with the erase operation (E) being omitted.

It is noted that the voltage pulse used for the erase operation (E) may be a combination of a plurality of voltage pulses. The combination needs to satisfy the following requirements: all the applied voltages need to have the same polarity, and the threshold needs to reach an intended threshold after application of the pulses.

Next, a third embodiment of the invention is described.

Here, a description is given of the enhancement of retention characteristics in the case of injecting holes. The description can be made on the analogy of the second embodiment for enhancing retention characteristics in the case of injecting electrons. In order to enhance retention characteristics, hole injection intended for retention is followed by a program operation (F).

Figure 14:
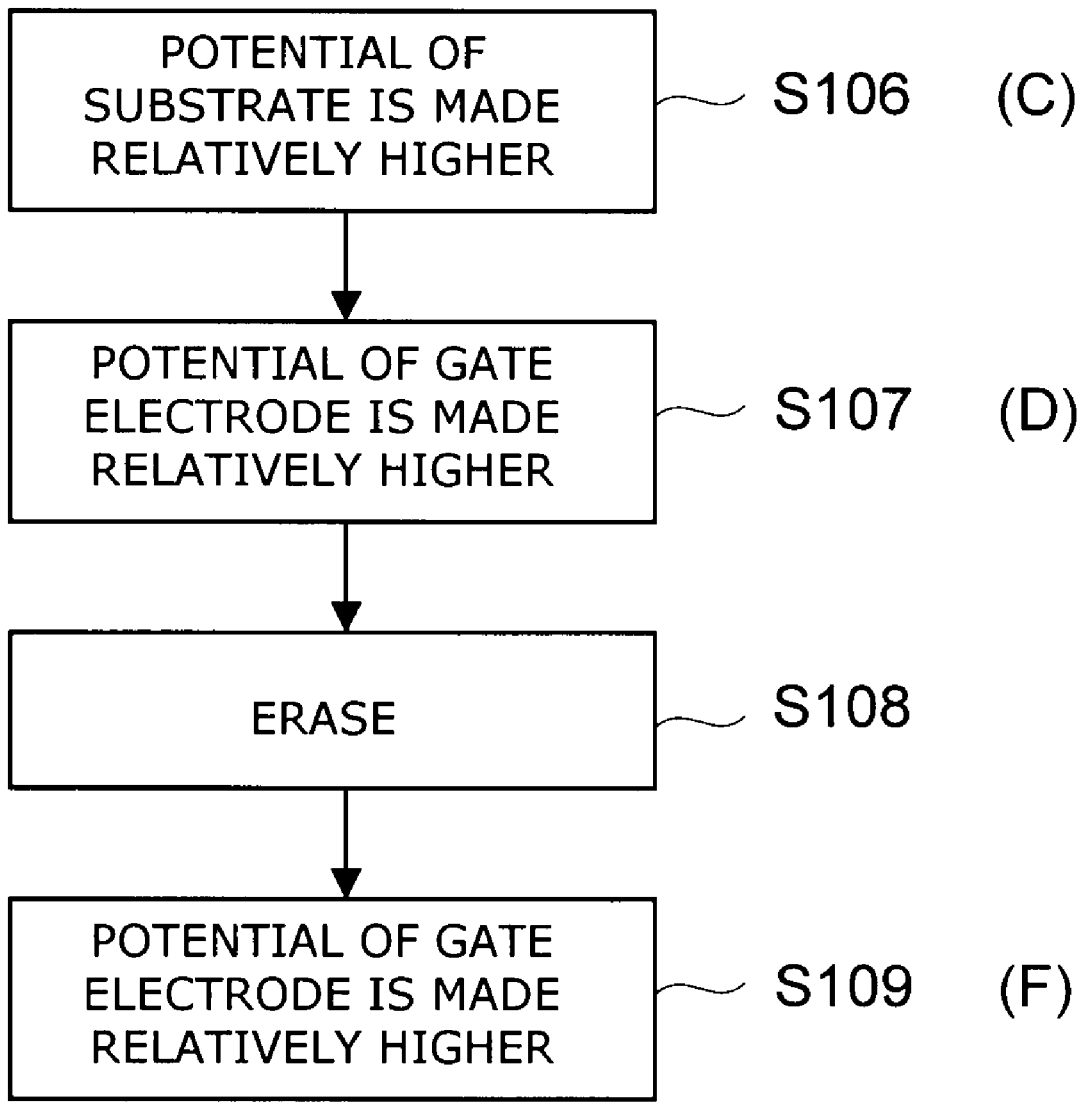
FIG. 14 is a process diagram showing the sequence of a method for driving a nonvolatile semiconductor memory device according to a second embodiment of the invention.

FIG. 14 is a process diagram showing the sequence of a method for driving a nonvolatile semiconductor memory device according to this embodiment.

In this embodiment, in addition to steps S106 to step S108 shown in FIG. 3B, the potential of the gate electrode 4 is made higher than that of the semiconductor substrate 1 in step S109 in order to enhance the retention characteristics for holes injected in step S108. This corresponds to the program operation (F).

In the following, a description is given of the enhancement of hole retention characteristics resulting from electron injection in this program operation (F).

FIG. 10C shows a time chart for setting the threshold after an erase operation. The program operation (F) on the NAND string of FIG. 8 is performed in accordance with this time chart. Hole injection is performed during the time interval T2-T3. For example, holes are injected into the memory cells M1-Mn by collective erase operation on the NAND string. Specifically, with the potential of the word lines WL1-WLn held at 0 V, an erase voltage $V_{ERS}$ is applied to the semiconductor substrate 1. Let $V_{TH,5}$ be the threshold reached by the hole injection. Then the program operation (F) is collectively performed during the time interval T3-T4. Specifically, with the potential of the bit line BL2 held at 0 V, a voltage of approximately 5 V is applied to the select gate SG2 to turn the transistor S2 into the conducting state. Furthermore, a voltage $V_{PGM}$ used for the program operation (F) is applied to the word lines WL1-WLn. Let $\Delta V_{TH,5}$ be the amount of threshold variation resulting from the program operation (F). Consequently, the threshold of the memory cells M1-Mn becomes:

$$V_{TH,6} = V_{TH,5} + \Delta V_{TH,5} \quad (10)$$

After time T4, charge retention continues until the next charge injection is performed.

In FIG. 2, the charge distribution in the charge storage layer 3B immediately after the execution of the program operation (F) following hole injection is such that electrons are captured near the interface with the semiconductor substrate 1 and holes are captured near the interface with the gate electrode 4. In the subsequent process of charge retention, the injected holes are released from the charge storage layer 3B, attenuating the threshold. On the other hand, charge redistribution or electron-hole recombination occurs. How the charge redistribution or electron-hole recombination occurs can be described on the analogy of the charge redistribution or recombination in the second embodiment with the polarity of electrons and holes being reversed.

In setting the voltage used for the program operation (F), electrical damage to the insulating film 3A needs to be taken into consideration. Preferably, electric field applied to the insulating film 3A is 20 MV/cm or less. More preferably, for rapid operation at low voltage, electric field applied to the insulating film 3A is 15 MV/cm or less, and the application time is 10 seconds or less. By way of example, for the purpose of demonstrating the effect of the program operation (F) on the retention characteristics, the program operation (F) was performed on the memory cell 2. The result of characterizing the retention characteristics in this setup is represented by the mark ◇ in FIG. 13. In forming the program level "11" in FIG. 13, once an erase operation was performed, the program operation (F) was performed. Specifically, the voltage value and the application time of the program operation (F) for forming the program level "11" were 20 V and 10 nanoseconds, respectively. The result of characterizing the retention characteristics without the program operation (F) is represented by the mark Δ. As seen from FIG. 13, retention with the program operation (F) being performed has higher retention characteristics than retention with the program operation (F) being omitted.

It is noted that the voltage pulse used for the program operation (F) may be a combination of a plurality of voltage pulses. The combination needs to satisfy the following requirements: all the applied voltages need to have the same polarity, and the threshold needs to reach an intended threshold after application of the pulses.

Next, a nonvolatile semiconductor memory device according to the embodiment of the invention is described.

More specifically, the nonvolatile memory cell of the invention described with reference to FIGS. 1 to 14 can be incorporated into a peripheral circuit and installed in a nonvolatile semiconductor memory device.

Figure 15:
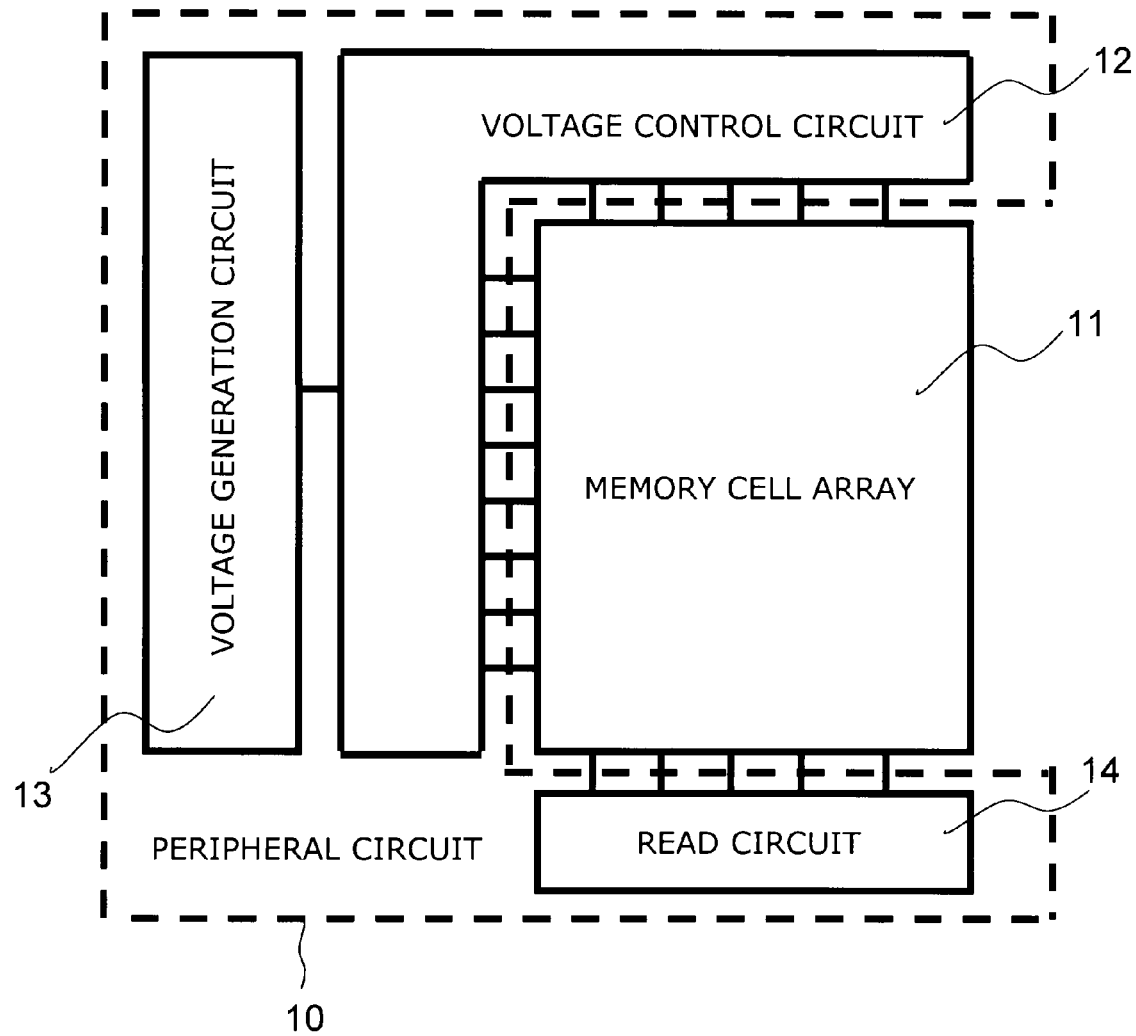
FIG. 15 is a schematic view illustrating a schematic configuration of a nonvolatile semiconductor memory device.

FIG. 15 is a schematic view illustrating a schematic configuration of such a nonvolatile semiconductor memory device.

The nonvolatile semiconductor memory device shown includes a memory cell array 11 and a peripheral circuit 10. Each memory cell in the memory cell array 11 is a transistor type memory cell having a laminated insulating film including a charge storage layer. The peripheral circuit 10 is composed of a voltage generation circuit 13 for generating a program voltage, an erase voltage, or a read voltage, a voltage control circuit 12 for coupling the voltage generated in the voltage generation circuit 13 to the memory cell array 11, and a read circuit 14 for reading information programmed in the memory cell array 11. The voltage required for implementing the preset 1, the preset 2, the erase operation (E), or the program operation (F) described in the first to third embodiment is supplied from the voltage generation circuit. The application time required for each operation is controlled by the voltage control circuit 12.

The embodiments of the invention have been described with reference to examples. However, the invention is not limited to the above examples. For instance, the examples can be combined with each other as long as technically feasible, and such combinations are also encompassed within the scope of the invention. Specifically, the program or erase operation described above with reference to the first embodiment can be followed by the retention described above with reference to the second or third embodiment.

The first to third embodiment can be applied to any memory cells comprising a laminated insulating film including a charge storage layer. Furthermore, the material of the semiconductor substrate 1 is not limited to a silicon substrate, but may be a polysilicon substrate, a SiGe substrate, a Ge substrate, or a SiGeC substrate. The configuration of the semiconductor substrate 1 is not limited to a P-type well or a P-type semiconductor layer (SOI), but may be SGOI (silicon germanium on insulator) or GOI (germanium on insulator).

The memory cell may be configured as a vertical transistor or a FIN transistor. Alternatively, the memory cell array itself may have a vertically laminated structure.

The invention is applicable to various memory cell arrays as long as it has memory cells comprising a laminated insulating film including a charge storage layer. Such memory cell arrays include not only of the NAND type and the NOR type, but also of the AND type (H. Kume, M. Kato, T. Adachi, T. Tanaka, T. Sasaki, T. Okazaki, N. Miyamoto, S. Saeki, Y. Ohji, M. Ushiyama, J. Yagami, T. Morimoto, and T. Nishida, "A 1.28 $\mu m^2$ contactless memory cell technology for a 3V-only 64 Mbit EEPROM", IEDM Tech. Dig., pp. 991-993, December (1992)), the DINOR type (H. Onoda, Y. Kunori, S. Kobayashi, M. Ohi, A. Fukumoto, N. Ajika, and H. Miyoshi, "A novel cell structure suitable for a 3 volt operation, sector erase flash memory", IEDM Tech. Dig., pp. 599-602, December (1992)), the split gate type (G. Samachisa, C. Su, Y. Kao, G. Smarandoiu, T. Wong, and C. Hu, "A 128K flash EEPROM using double polysilicon technology", ISSCC Dig. Tech. Papers, pp. 76-77, February (1987)), the stack type (V. N. Kynett, A. Baker, M. Fandrich, G. Hoekstra, O. Jungroth, J. Kreifels, and S. Wells, "An in-system reprogrammable 256K CMOS flash memory", ISSCC Dig. Tech. Papers, pp. 132-133, February (1988)), the triple layer polysilicon type (F. Masuoka, M. Asano, H. Iwashita, T. Komuro, and S. Tanaka, "A new flash EEPROM cell using triple polysilicon technology", IEDM Tech. Dig., pp. 464-467, December (1984)), and the 3Tr-NAND (JP-A 2007-115407(Kokai)).

The invention claimed is:

1. A method for driving a nonvolatile semiconductor memory device comprising source/drain diffusion layers spaced from each other in a surface portion of a semiconductor substrate, a laminated insulating film formed on a channel between the source/drain diffusion layers and including a charge storage layer, and a gate electrode formed on the laminated insulating film, the nonvolatile semiconductor memory device having a first data memory state and a second data memory state different from the first data memory state, the method comprising:
performing a first operation to change to the first data memory state from the second data memory state; and
performing a second operation to change to the second data memory state from the first data memory state,
the performing the first operation including:
injecting first charges having a first polarity into the charge storage layer from the semiconductor substrate; and
after injecting the first charges into the charge storage layer, injecting second charges having a second polarity opposite to the first polarity into the charge storage layer from the semiconductor substrate by providing a potential difference between the semiconductor substrate and the gate electrode,
the performing the second operation including injecting third charges having the second polarity into the charge storage layer from the semiconductor substrate.

2. The method according to claim 1, wherein
the injecting first charges includes injecting electrons into the charge storage layer, and
the providing the potential difference includes making a potential of the semiconductor substrate to be higher than a potential of the gate electrode.

3. The method according to claim 2, wherein the potential difference is 25 volts or less, and application time of the potential difference is 30 seconds or less.

4. The method according to claim 1, wherein
the injecting first charges includes injecting holes into the charge storage layer, and
the providing the potential difference includes making a potential of the gate electrode to be higher than a potential of the semiconductor substrate.

5. The method according to claim 4, wherein the potential difference is 25 volts or less, and application time of the potential difference is 30 seconds or less.

6. The method according to claim 1, wherein the laminated insulating film includes a first insulating film provided on the semiconductor substrate side, a second insulating film provided on the gate electrode side, and the charge storage layer provided between the first insulating film and the second insulating film.

7. The method according to claim 1, wherein
the performing the second operation further includes,
after injecting the third charges into the charge storage layer, injecting fourth charges having the first polarity into the charge storage layer from the semiconductor substrate by providing a potential difference between the semiconductor substrate and the gate electrode.

8. A method for driving a nonvolatile semiconductor memory device including a memory cell, the memory cell comprising a semiconductor layer including a channel, a laminated insulating film formed on the channel and including a charge storage layer, and a gate electrode formed on the laminated insulating film, the memory cell having a first data memory state and a second data memory state different from the first data memory state, the method comprising:
performing a first operation to change to the first data memory state from the second data memory state; and
performing a second operation to change to the second data memory state from the first data memory state,
the performing the first operation including:
injecting first charges having a first polarity into the charge storage layer from the semiconductor layer; and
after injecting the first charges into the charge storage layer, injecting second charges having a second polarity opposite to the first polarity into the charge storage layer from the semiconductor layer by providing a potential difference between the semiconductor layer and the gate electrode,
the performing the second operation including injecting third charges having the second polarity into the charge storage layer from the semiconductor layer.

9. The method according to claim 8, wherein
the injecting first charges includes injecting electrons into the charge storage layer, and
the providing the potential difference includes making a potential of the semiconductor layer to be higher than a potential of the gate electrode.

10. The method according to claim 9, wherein the potential difference is 25 volts or less, and application time of the potential difference is 30 seconds or less.

11. The method according to claim 8, wherein the injecting first charges includes injecting holes into the charge storage layer, and the providing the potential difference includes making a potential of the gate electrode to be higher than a potential of the semiconductor layer.

12. The method according to claim 11, wherein the potential difference is 25 volts or less, and application time of the potential difference is 30 seconds or less.

13. The method according to claim 8, wherein the laminated insulating film includes a first insulating film provided on the semiconductor layer side, a second insulating film provided on the gate electrode side, and the charge storage layer provided between the first insulating film and the second insulating film.

14. The method according to claim 8, wherein
the performing the second operation further includes,
after injecting the third charges into the charge storage layer, injecting fourth charges having the first polarity into the charge storage layer from the semiconductor layer by providing a potential difference between the semiconductor layer and the gate electrode.

15. The method according to claim 8, wherein the memory cell is multiply provided, each of the memory cells has the semiconductor layer, the laminated insulating film, and the gate electrode and has the first data memory state and the second data memory state, and the method includes the performing the first operation and the performing the second operation in at least one of the multiple memory cells.

* * * * *